United States Patent
Yang et al.

(10) Patent No.: US 10,497,566 B1
(45) Date of Patent: Dec. 3, 2019

(54) LAYOUT DESIGN FOR FANOUT PATTERNS IN SELF-ALIGNED DOUBLE PATTERNING PROCESS

(71) Applicant: MACRONIX INTERNATIONAL CO., LTD., Hsinchu (TW)

(72) Inventors: Chin-Cheng Yang, Kaohsiung (TW); Chi-Hao Huang, Hsinchu (TW); Wei-Hung Wang, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/012,608

(22) Filed: Jun. 19, 2018

(51) Int. Cl.
| | |
|---|---|
| *H01L 21/033* | (2006.01) |
| *H01L 23/522* | (2006.01) |
| *H01L 23/528* | (2006.01) |
| *H01L 21/768* | (2006.01) |
| *H01L 27/105* | (2006.01) |

(52) U.S. Cl.
CPC ...... *H01L 21/0338* (2013.01); *H01L 21/0335* (2013.01); *H01L 21/0337* (2013.01); *H01L 21/76816* (2013.01); *H01L 21/76877* (2013.01); *H01L 23/528* (2013.01); *H01L 23/5226* (2013.01); *H01L 27/105* (2013.01)

(58) Field of Classification Search
CPC ... H01L 23/528; H01L 23/48; H01L 23/5283; H01L 21/823871; H01L 21/0338
See application file for complete search history.

(56) References Cited

U.S. PATENT DOCUMENTS

| | | | |
|---|---|---|---|
| 7,838,996 B2 * | 11/2010 | Sato | H01L 21/32139 257/775 |
| 8,810,036 B2 * | 8/2014 | Min | H01L 27/0203 257/773 |
| 8,922,020 B2 | 12/2014 | Chen et al. | |
| 8,941,166 B2 | 1/2015 | Chen et al. | |

(Continued)

FOREIGN PATENT DOCUMENTS

CN 101673003 A 3/2010

OTHER PUBLICATIONS

Gao et al., "Flexible Self-Aligned Double Patterning Aware Detailed Routing with Prescribed Layout Planning," ECE Dept. Univ. of Texas at Austin, Downloaded on Apr. 9, 2018 http://ispd.cc/ISPD12Slides/ISPD12_1_4.pdf, 38 pages.

(Continued)

*Primary Examiner* — David A Zarneke
(74) *Attorney, Agent, or Firm* — Haynes Beffel & Wolfeld LLP

(57) ABSTRACT

A circuit structure comprises a plurality of first conducting lines extending in a first direction, the first conducting lines having a first pitch in a second direction orthogonal to the first direction; a plurality of linking lines extending in the second direction, the linking lines having a second pitch in the first direction, the second pitch being greater than the first pitch; and a plurality of connection structures connecting respective first conducting lines for current flow to respective linking lines, the connection structures each including a plurality of segments extending in the first direction, segments in the plurality of segments having a transition pitch in the second direction relative to adjacent segments in the plurality of segments greater than or equal to the first pitch, and less than the second pitch.

21 Claims, 13 Drawing Sheets

(56) References Cited

U.S. PATENT DOCUMENTS

| | | |
|---|---|---|
| 9,153,535 B1 | 10/2015 | Wu et al. |
| 9,330,764 B2 | 5/2016 | Lin et al. |
| 9,673,051 B1 | 6/2017 | Lee |
| 2009/0154240 A1 | 6/2009 | Park et al. |
| 2010/0244269 A1* | 9/2010 | Kim .................. H01L 21/0337 257/773 |
| 2011/0151668 A1* | 6/2011 | Tang ................. H01L 21/0337 438/671 |
| 2012/0168955 A1 | 7/2012 | Chen et al. |
| 2012/0241834 A1* | 9/2012 | Nakajima .......... H01L 21/0337 257/316 |
| 2013/0082388 A1* | 4/2013 | Matsuda .......... H01L 27/11519 257/773 |
| 2015/0179647 A1* | 6/2015 | Lin .................. H01L 21/82385 257/377 |
| 2016/0099217 A1 | 4/2016 | Peng |
| 2017/0294442 A1 | 10/2017 | Hung et al. |

OTHER PUBLICATIONS

Ban et al., "Layout Decomposition of Self-Aligned Double Patterning for 2D Random Logic Patterning," Proc. of SPIE, vol. 7974, 2011, 15 pages.
Ban et al., "Self-Aligned Double Patterning Layout Decomposition for Two-Dimensional Random Metals for Sub-10-nm Node Design," Journal of Micro/Nanolithography, MEMS and MOEMS, 16 pages.
EP Extended Search Report in Application No. 18180832.0 dated Feb. 12, 2019, 8 pages.

* cited by examiner

LAYOUT DESIGN FOR FANOUT PATTERNS IN SELF-ALIGNED DOUBLE PATTERNING PROCESS

BACKGROUND

Field of the Technology

The technology disclosed relates to patterned strips of material on integrated circuits and their fabrication, including the use of self-aligned multiple patterning methods to fabricate integrated circuits.

Description of Related Art

Integrated circuits are commonly used to make a wide variety of electronic devices, such as memory chips. There is a strong desire to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent word lines) is often used as a representative measure of the circuit's density.

Increases in circuit density often are limited by the resolution of the available photolithographic equipment. The minimum size of features and spaces that a given piece of photolithographic equipment can produce is related to its resolution capacity.

The sum of the minimum feature width and minimum space width producible with a given piece of photolithographic equipment is the minimum pitch that the piece of equipment can produce. The minimum feature width can often times be approximately equal to the minimum space width, so the minimum pitch that can be produced with a given piece of photolithographic equipment is approximately equal to double the minimum feature width that it can produce.

One way to reduce the pitch of an integrated circuit device below that of the minimum pitch produced lithographically is through the use of double or quadruple patterning, sometimes referred to as multiple patterning. Through this method a single mask is typically used to create a series of parallel strips of material on the substrate. Different methods can then be used to transform each parallel strip of material into multiple parallel strips of material. The various methods typically use a series of deposition and etching steps to do so.

Optical proximity effects can occur during optical lithography. Optical proximity effects are the variations in the line width of a feature as a function of the proximity of other nearby features.

In a mask for manufacturing an integrated circuit using a multiple patterning process, a fanout pattern connects an array pattern for word lines in a memory array to a pad pattern for landing pads. An array pattern has a uniform pitch and a critical dimension bias (i.e. line/space ratio within a pitch) for the word lines. A fanout pattern has pitches different than the uniform pitch for the word lines, and a larger critical dimension bias than for the array pattern. Due to optical proximity effects, the non-uniformity of the pitches in the fanout pattern and the larger critical dimension bias of the fanout pattern can cause reliability issues with word lines, such as weakened/narrower word lines or shorted adjacent word lines near a fanout pattern.

It is desirable to provide technology which can minimize the optical proximity effects in a fanout area, so word lines near a fanout pattern can be reliably manufactured.

SUMMARY

The present invention provides a circuit structure comprising a plurality of first conducting lines such as word lines, extending in a first direction, a plurality of linking lines extending in the second direction to connect corresponding first conducting lines to features having larger pitch, such as contact landing pads, and a plurality of connection structures connecting respective first conducting lines for current flow to respective linking lines.

The first conducting lines can be configured in pairs, as a result of formation by self-aligned double patterning for example, or for the purposes of layout of the structures on the device. Likewise the linking lines can be configured in pairs, as a result of being made in the same manufacturing steps as the first conducting lines. The pairs of first conducting lines have a first pitch in a second direction orthogonal to the first direction. The pairs of linking lines each have a first linking line and a second linking line. The pairs of linking lines have a second pitch in the first direction, the second pitch being greater than the first pitch.

Each of the connection structures includes a plurality of segments extending in the first direction, segments in the plurality of segments having a transition pitch in the second direction relative to adjacent segments in the plurality of segments greater than or equal to the first pitch, and less than the second pitch.

Segments in the plurality of segments can have a plurality of pitches, wherein the transition pitch between two segments in the plurality of pitches proximal to the linking lines can be larger than the transition pitch between two segments in the plurality of pitches proximal to the first conducting lines. The pitches in the plurality of pitches can increase with distances of the segments in the plurality of segments away from the first conducting lines.

Connection structures in the plurality of connection structures have a connection structure pitch in the first direction, and the segments in the plurality of segments have lengths extending a majority of the connection structure pitch. Adjacent connection structures in the plurality of connection structures can be offset by twice the first pitch in the second direction. Adjacent pairs of first conducting lines in the plurality of first conducting lines can terminate at respective adjacent connection structures in the plurality of connection structures.

A plurality of landing pads can be connected to respective linking lines in the plurality of linking lines.

Segments in the plurality of segments each have a first end and a second end opposite the first end in the first direction. The plurality of segments can include a first set of pairs of segments each connected at the first end via respective first segments extending in the second direction, and a second set of pairs of segments each connected at the second end via respective second segments extending in the second direction. The pairs of segments in the first set can be interdigitated with the pairs of segments in the second set in the second direction.

The plurality of segments can include at least one pair of segments connected at the first end via a first segment in the second direction and connected at the second end via a second segment extending in the second direction.

The plurality of segments can include a first set of pairs of segments aligned at the second end and each connected at the first end via respective first segments extending in the second direction, and a second set of pairs of segments aligned at the first end and each connected at the second end via respective second segments extending in the second direction, the first and second segments extending in the second direction being not aligned in the first direction.

Connection structures in the plurality of connection structures have a connection structure pitch in the first direction relative to adjacent connection structures in the plurality of connection structures. A sum of a first length of a first pair of segments in the first set of pairs of segments and a second length of a second pair of segments in the second set of pairs of segments aligned with the first pair of segments in the second direction can extend a majority of the connection structure pitch.

The circuit structure can include a plurality of blocks of memory cells, blocks in the plurality of blocks including the first conducting lines configured as respective local word lines; a plurality of fanout structures, fanout structures in the plurality of fanout structures including respective connection structures and respective linking lines; a plurality of landing pads, landing pads in the plurality of landing pads connected to the respective linking lines; and a plurality of global word lines, global word lines in the plurality of global word lines connected to respective landing pads.

A method for manufacturing a circuit structure as described herein is also provided. The method includes forming a mask over a substrate and executing a self-aligned double patterning process on the substrate using the mask.

The mask includes a plurality of first mask lines extending in a first direction, the first mask lines having a mask line pitch in a second direction orthogonal to the first direction. The mask includes a plurality of mask areas separated by mask area gaps having a mask area gap width in the first direction greater than the mask line pitch.

The mask includes a plurality of mask linking lines extending in the second direction having a mask line width greater than the mask line pitch and less than twice the mask line pitch, the mask linking lines connecting respective mask areas to respective first mask lines.

The mask includes a plurality of transition structures disposed between respective pairs of mask linking lines, the transition structures each including a plurality of mask segments extending in the first direction. Mask segments in the plurality of mask segments can have a transition pitch in the second direction relative to adjacent mask segments in the plurality of mask segments greater than or equal to the mask line pitch, and less than the mask area gap width.

Mask segments in the plurality of mask segments can have a plurality of pitches, wherein the transition pitch between two segments in the plurality of pitches proximal to the mask areas is larger than the transition pitch between two segments in the plurality of pitches proximal to the first mask lines. The pitches in the plurality of pitches can increase with distances of the mask segments in the plurality of mask segments away from the first mask lines.

A mask area in the plurality of mask areas has a first side parallel to and proximal to mask segments in the plurality of mask segments. The plurality of mask segments includes an adjacent mask segment to the first side of the mask area, the adjacent mask segment having a first side distal to the first side of the mask area and a second side proximal to the first side of the mask area. A pitch in the plurality of pitches between the first side of the mask area and the first side of the adjacent mask segment is greater than the mask line pitch and less than twice the mask line pitch.

Transition structures in the plurality of transition structures have a transition structure pitch in the first direction relative to adjacent transition structures in the plurality of transition structures, and the mask segments in the plurality of mask segments can have lengths extending a majority of the transition structure pitch. Adjacent transition structures in the plurality of transition structures can be offset by the mask line pitch in the second direction. Adjacent first mask lines in the plurality of first mask lines can terminate at respective adjacent transition structures in the plurality of transition structures.

Mask segments in the plurality of mask segments each have a first end and a second end opposite the first end in the first direction. The plurality of mask segments disposed between a pair of mask linking lines can include a first set of mask segments connected at the first end to a first mask line in the pair and separated at the second end from a mask linking line in the pair, and a second set of mask segments connected at the second end to the mask linking line in the pair and separated at the first end from the first mask line in the pair, where mask segments in the first set can be interdigitated with mask segments in the second set in the second direction.

The plurality of mask segments disposed between a pair of mask linking lines can include at least a mask segment separated at the first end from a first mask line in the pair and separated at the second end from a mask linking line in the pair.

The plurality of mask segments disposed between a pair of mask linking lines can include a first set of mask segments connected at the first end to a first mask line in the pair and not aligned at the second end, and a second set of mask segments connected at the second end to the mask linking line in the pair and not aligned at the first end, mask segments in the first set of mask segments being aligned with respective mask segments in the second set of mask segments in the second direction. A sum of a first length of a first mask segment in the first set of mask segments and a second length of a second mask segment in the second set of mask segment aligned with the first mask segment in the second direction can extend a majority of the transition structure pitch.

The substrate can include a layer of sacrificial material over a layer of hard mask material over a layer of conductive material. Executing a self-aligned double patterning process can include etching the layer of sacrificial material to form a sacrificial pattern using the mask as described herein. Sidewall spacers can be formed on the layer of hard mask material. The sacrificial pattern can be removed while the sidewall spacers remain. The layer of hard mask material can be etched using the sidewall spacers as an etch mask to form a hard mask. The layer of conductive material can be etched using the hard mask to form conducting lines.

Other aspects and advantages of the present invention can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

The technology as described herein is applicable to multiple patterning including double patterning. The technology is described with reference to double patterning as an example. The example includes first conducting lines grouped in pairs such as word lines grouped in pairs. In multiple patterning other than double pattering, the word lines may not be grouped in pairs.

Figure 1:
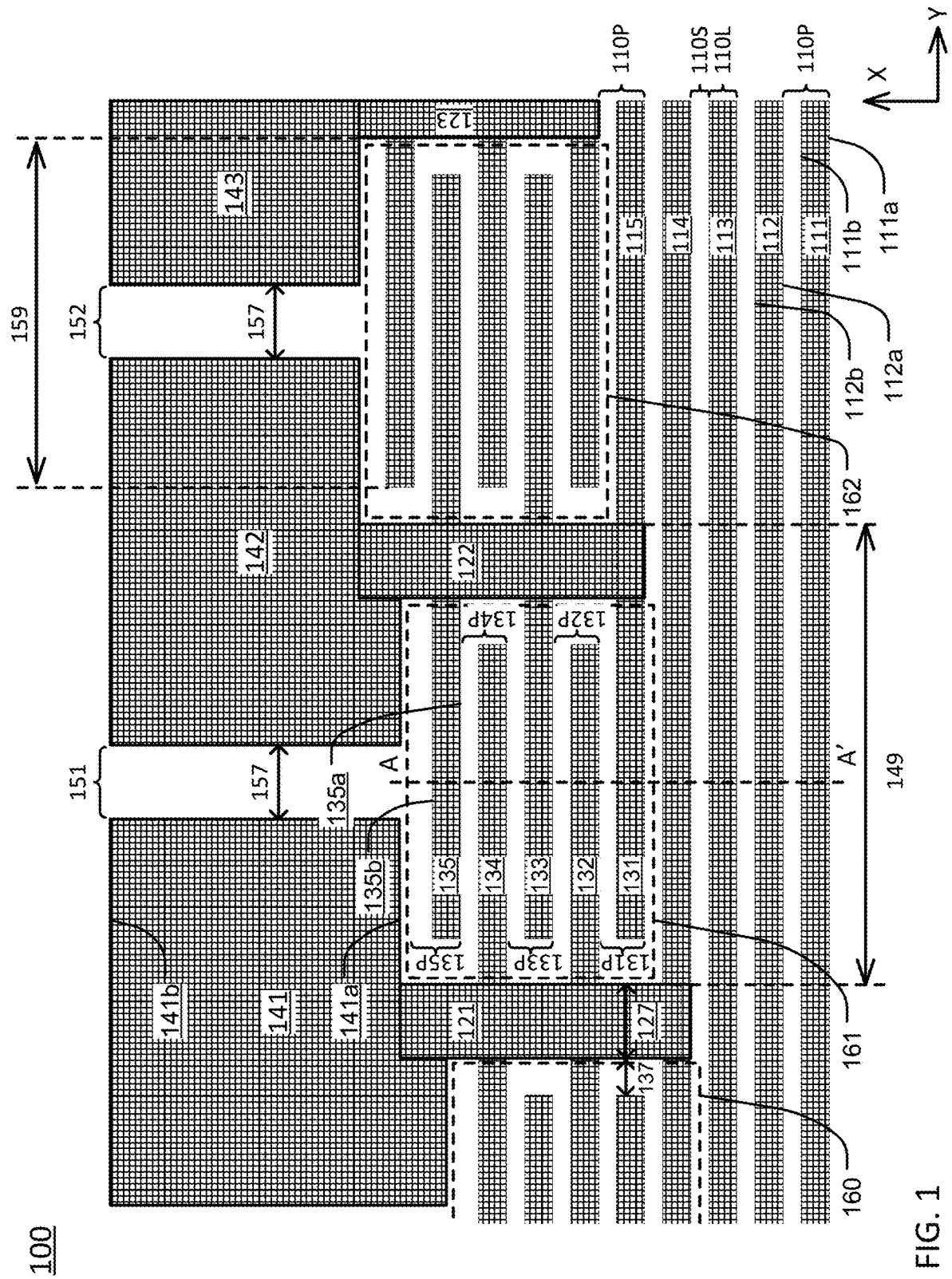
FIG. 1 illustrates a mask including a plurality of first mask lines, a plurality of mask areas, a plurality of mask linking lines, and a plurality of transition structures, in accordance with a first embodiment.

FIG. 1 shows a mask 100 including a plurality of first mask lines (111-115), a plurality of mask areas (141-143), a plurality of mask linking lines (121-123), and a plurality of transition structures (160-162), in accordance with a first embodiment. The mask can be a photolithographic mask that defines a pattern for fabrication of a circuit structure as described herein. The pattern includes the first mask lines, the mask areas, the mask linking lines, and the transition structures that are opaque to light, and open areas that allow light to shine through. The mask can be used use with a self-aligned double patterning process to manufacture a plurality of first conducting lines, a plurality of linking lines, and a plurality of connection structures as described in connection with FIG. 2.

A plurality of first mask lines (111-115) extends in a first direction (Y-direction). The first mask lines each have a first side (111a, 112a) and a second side (111b, 112b) opposite the first side. The first mask lines have a mask line pitch 110P in a second direction (X-direction) orthogonal to the first direction, between first sides of adjacent first mask lines (111a and 112a). For instance, the mask line pitch 110P can be 78 nm (nanometers), including a line width 110L of 48 nm between the first and second sides of a first mask line, and a space width 110S of 30 nm between adjacent mask lines.

Adjacent mask areas in a plurality of mask areas (e.g. 141, 142, 143) are separated by mask area gaps (151, 152) that have a mask area gap width 157 in the first direction greater than the mask line pitch 110P. Mask areas (e.g. 141) in the plurality of mask areas have a first side 141a parallel to and proximal to mask segments in the plurality of mask segments (131-135), and a second side 141b opposite the first side in the second direction and distal to the mask segments. Adjacent mask areas (e.g. 141, 142) in the plurality of mask areas can be separated in the first direction by varying distances between the first side 141a and the second side 141b. The mask area gap width 157 can correspond to a minimum of the varying distances.

A plurality of mask linking lines (121, 122, 123) extends in the second direction (X-direction) having a mask line width 127 greater than the mask line pitch 110P and less than twice the mask line pitch 110P. For instance, the mask line width 127 can have a range of 100 nm-150 nm, while the mask line pitch 100P can be about 78 nm. The mask linking lines (e.g. 121, 122) connect respective mask areas (e.g. 141, 142) to respective first mask lines (e.g. 114, 115).

A plurality of transition structures (e.g. 161) is disposed between respective pairs of mask linking lines (e.g. 121, 122). The transition structures each include a plurality of mask segments (131-135) extending in the first direction (Y-direction). Mask segments in the plurality of mask segments have a transition pitch (e.g. 131P-135P) in the second direction (X-direction) relative to adjacent mask segments in the plurality of mask segments greater than or equal to the mask line pitch 110P, and less than the mask area gap width 157. The mask segments each have a first side and a second side opposite the first side. A transition pitch (e.g. 131P) can be between first sides of a pair of adjacent mask segments (e.g. 131, 132).

Mask segments in the plurality of mask segments can have a plurality of pitches (131P-135P), wherein the transition pitch between two segments in the plurality of pitches proximal to the mask areas can be larger than the transition pitch between two segments in the plurality of pitches proximal to the first mask lines. For instance, the transition pitch 134P between two segments 134 and 135 proximal to the mask areas 141 and 142 can be 90 nm which is larger than the transition pitch 131P of 78 nm between two segments 131 and 132 proximal to the first mask line 114. The pitches in the plurality of pitches (e.g. 131P, 132P, 133P) can be between first sides of respective pairs of adjacent mask segments (e.g. 131 and 132, 132 and 133, 133 and 134).

The pitches in the plurality of pitches (131P-135P) can increase in the second direction (X-direction) with distances of the mask segments in the plurality of mask segments away from the first mask lines. For instance, the pitches in the plurality of pitches (131P-135P) can increase with distances of the mask segments (131-135) away from the first mask lines from 78 nm for 131P to 84 nm, 84 nm, 90 nm and 100 nm for 132P-135P respectively.

A mask area (e.g. 141) in the plurality of mask areas has a first side (e.g. 141a) parallel to and proximal to mask segments in the plurality of mask segments (131-135), and a second side 141b opposite the first side in the second direction and distal to the mask segments. The plurality of mask segments includes an adjacent mask segment 135 to the first side 141a of the mask area. The adjacent mask segment 135 has a first side 135a distal to the first side 141a of the mask area 141, and a second side 135b proximal to the first side 141a of the mask area 141. A pitch 135P in the plurality of pitches between the first side 141a of the mask area 141 and the first side 135a of the adjacent mask segment 135 is greater than the mask line pitch 110P and less than twice the mask line pitch 110P. The pitch 135P can be greater than other pitches in the plurality of pitches. For instance, the pitch 135P can be 120 nm, while the other pitches are between 78 nm and 90 nm.

Transition structures in the plurality of transition structures (e.g. 161) have a transition structure pitch 149 in the first direction relative to adjacent transition structures in the plurality of transition structures. The mask segments in the plurality of mask segments (131-135) have lengths 159 extending a majority of the transition structure pitch in the first direction (Y-direction). As used herein, a majority of the transition structure pitch refers to more than 50% of the transition structure pitch. For instance, for a transition structure pitch of 800 nm, a majority of the transition structure pitch refers to more than 400 nm.

Adjacent transition structures (e.g. 160, 161) in the plurality of transition structures can be offset by the mask line pitch 110P in the second direction (X-direction). Adjacent first mask lines (e.g. 114, 115) in the plurality of first mask lines can terminate at respective adjacent transition structures (e.g. 160, 161) in the plurality of transition structures.

Mask segments in the plurality of mask segments (131-135) each have a first end (left end) and a second end (right end) opposite the first end in the first direction (Y-direction). The plurality of mask segments disposed between a pair of mask linking lines (e.g. 121, 122) includes a first set of mask segments (e.g. 132, 134) connected at the first end to a first mask line 121 in the pair and separated at the second end from a mask linking line 122 in the pair by a gap width 137, and a second set of mask segments (e.g. 131, 133, 135) connected at the second end to the mask linking line 122 in the pair and separated at the first end from the first mask line 121 in the pair by the gap width 137. Mask segments in the first set (e.g. 132, 134) can be interdigitated with mask segments in the second set (e.g. 131, 133, 135) in the second direction.

A sum of the gap width 137 and the mask line width 127 can be greater than the mask line pitch 110P and less than four times the mask line pitch 110P. For example, the gap width 137 can have a range of about 30 nm to 100 nm, the mask line width 127 can have a range of about 100 nm to 150 nm, and the mask line pitch 110P can be 78 nm. In this example, a sum of the gap width 137 and the mask line width 127 can have a range of about 130 nm to 250 nm, which is greater than the mask line pitch 110P of 78 nm and less than four times the mask line pitch 110P.

Figure 2:
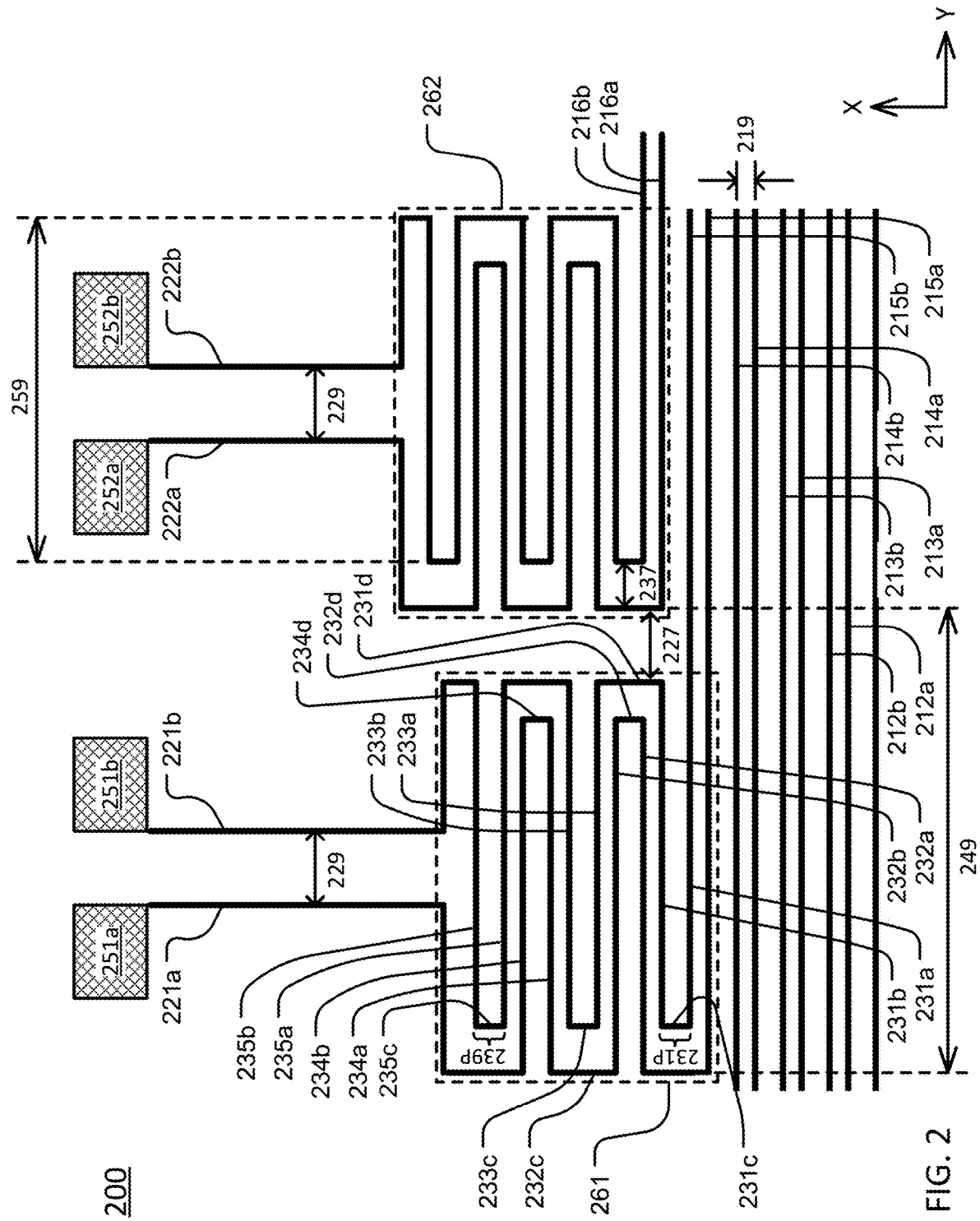
FIG. 2 illustrates an example circuit structure that can be manufactured using the mask as described in reference to FIG. 1.

FIG. 2 illustrates an example circuit structure that can be manufactured using the mask as described in reference to FIG. 1. A circuit structure 200 comprises a plurality of first conducting lines (215a and 215b, 214a and 214b, 213a and 213b, 212a and 212b) extending in a first direction (Y-direction). The first conducting lines can be configured in pairs, as a result of formation by self-aligned double patterning for example. A pair of first conducting lines has a first conducting line and a second conducting line (e.g. 215a, 215b). The pairs of first conducting lines have a first pitch 219 in a second direction (X-direction) orthogonal to the first direction. The first pitch 219 can be relative to adjacent conducting lines in the plurality of first conducting lines. For instance, the first pitch 219 can be between the first and second conducting lines in a pair of conducting lines (e.g. 214a, 214b). The first pitch 219 is further described in reference to FIG. 11G.

The circuit structure 200 comprises a plurality of linking lines (221a and 221b, 222a and 22b) extending in the second direction (X-direction). The linking lines can be configured in pairs, as a result of formation by self-aligned double patterning for example. A pair of linking lines has a first linking line and a second linking line (e.g. 221a, 221b). The linking lines have a second pitch 229 in the first direction (Y-direction) between the first and second linking lines in a pair of linking lines, the second pitch 229 being greater than the first pitch 219. The first and second linking lines (e.g. 221a, 221b) in a pair of linking lines can be separated in the first direction by varying distances between a connection structure (e.g. 261) and a pair of landing pads (e.g. 251a, 251b), if they are not disposed at a right angle relative to the first conducting lines or are not straight. The second pitch 229 can correspond to a minimum of the varying distances, and can be referred to as a minimum pitch.

The circuit structure 200 comprises a plurality of connection structures (261, 262) connecting respective pairs of first conducting lines (215a and 215b, 216a and 216b) for current flow to respective pairs of linking lines (221a and 221b, 222a and 222b). Connection structures (e.g. 261, 262) in the plurality of connection structures are separated by a connection structure gap width 227. The connection structures each include a plurality of segments (231a, 231b, 232a, 232b, 233a, 233b, 234a, 234b, 235a, 235b) extending in the first direction. Segments in the plurality of segments have a transition pitch (e.g. 239P) in the second direction relative to adjacent segments in the plurality of segments greater than or equal to the first pitch 219, and less than the second pitch 229.

Segments in the plurality of segments have a plurality of pitches (e.g. 231P, 239P), wherein the transition pitch (e.g. 239P) between two segments (e.g. 235a, 235b) in the plurality of pitches proximal to the linking lines (e.g. 221a, 221b) is larger than the transition pitch (e.g. 231P) between two segments (e.g. 231a, 231b) in the plurality of pitches proximal to the first conducting lines (e.g. 215a, 215b). The pitches in the plurality of pitches can increase in the second direction (X-direction) with distances of the segments in the plurality of segments away from the first conducting lines.

Connection structures in the plurality of connection structures (e.g. 261) have a connection structure pitch 249 in the first direction (Y-direction) relative to adjacent connection structures (e.g. 261, 262), and the segments in the plurality of segments have lengths 259 extending a majority of the connection structure pitch in the first direction. As used herein, a majority of the connection structure pitch refers to more than 50% of the connection structure pitch. For instance, for a connection structure pitch of 800 nm, a majority of the connection structure pitch refers to more than 400 nm.

Adjacent connection structures (e.g. 261, 262) in the plurality of connection structures can be offset by twice the first pitch 219 in the second direction. Adjacent pairs of first conducting lines (e.g. 216*a* and 216*b*, 215*a* and 215*b*) in the plurality of first conducting lines can terminate at respective adjacent connection structures (e.g. 262, 261) in the plurality of connection structures. More adjacent pairs of first conducting lines (e.g. 214*a* and 214*b*, 213*a* and 213*b*, 212*a* and 212*b*) in the plurality of first conducting lines can terminate at more respective adjacent connection structures in the plurality of connection structures (not shown).

A plurality of landing pads (e.g. 251*a* and 251*b*, 252*a* and 252*b*) can be connected to respective linking lines (221*a* and 221*b*, 222*a* and 222*b*) in the plurality of linking lines. For instance, pairs of landing pads (e.g. 251*a* and 251*b*) in the plurality of landing pads can be connected to respective pairs of linking lines (221*a* and 221*b*) in the plurality of linking lines.

Segments in the plurality of segments each have a first end (left end) and a second end (right end) opposite the first end in the first direction. The plurality of segments can include a first set of pairs of segments (e.g. 231*a* and 231*b*, 233*a* and 233*b*, 235*a* and 235*b*) each connected at the first end via respective first segments (e.g. 231*c*, 233*c*, 235*c*) extending in the second direction, and a second set of pairs of segments (232*a* and 232*b*, 234*a* and 234*b*) each connected at the second end via respective second segments (e.g. 232*d*, 234*d*) extending in the second direction. The pairs of segments in the first set can be interdigitated with the pairs of segments in the second set in the second direction.

Pairs in the first set of pairs of segments each have a first segment and a second segment opposite the first segment in the second direction. A second segment (231*b*) of a first pair (231*a* and 231*b*) in the first set is connected at the second end to a first segment (233*a*) of a second pair (233*a* and 233*b*) in the first set adjacent the first pair via a third segment (231*d*) in the second direction.

Pair in the second set of pairs of segments each have a first segment and a second segment opposite the first segment in the second direction. A second segment (232*b*) of a first pair (232*a* and 232*b*) in the second set is connected at the first end to a first segment (234*a*) of a second pair (234*a* and 234*b*) in the second set adjacent the first pair via a fourth segment (232*c*) in the second direction.

The first end of the segments in the first set of pairs of segments can be spaced apart from the first end of the segments in the second set of pairs of segments by a gap width 237 in the first direction. Similarly the second end of the segments in the first set of pairs of segments can be spaced apart from the second end of the segments in the second set of pairs of segments by the gap width 237 in the first direction. A sum of the gap width 237 and the connection structure gap width 227 can be greater than the first pitch 219 and less than eight times the first pitch 219.

Figure 3:
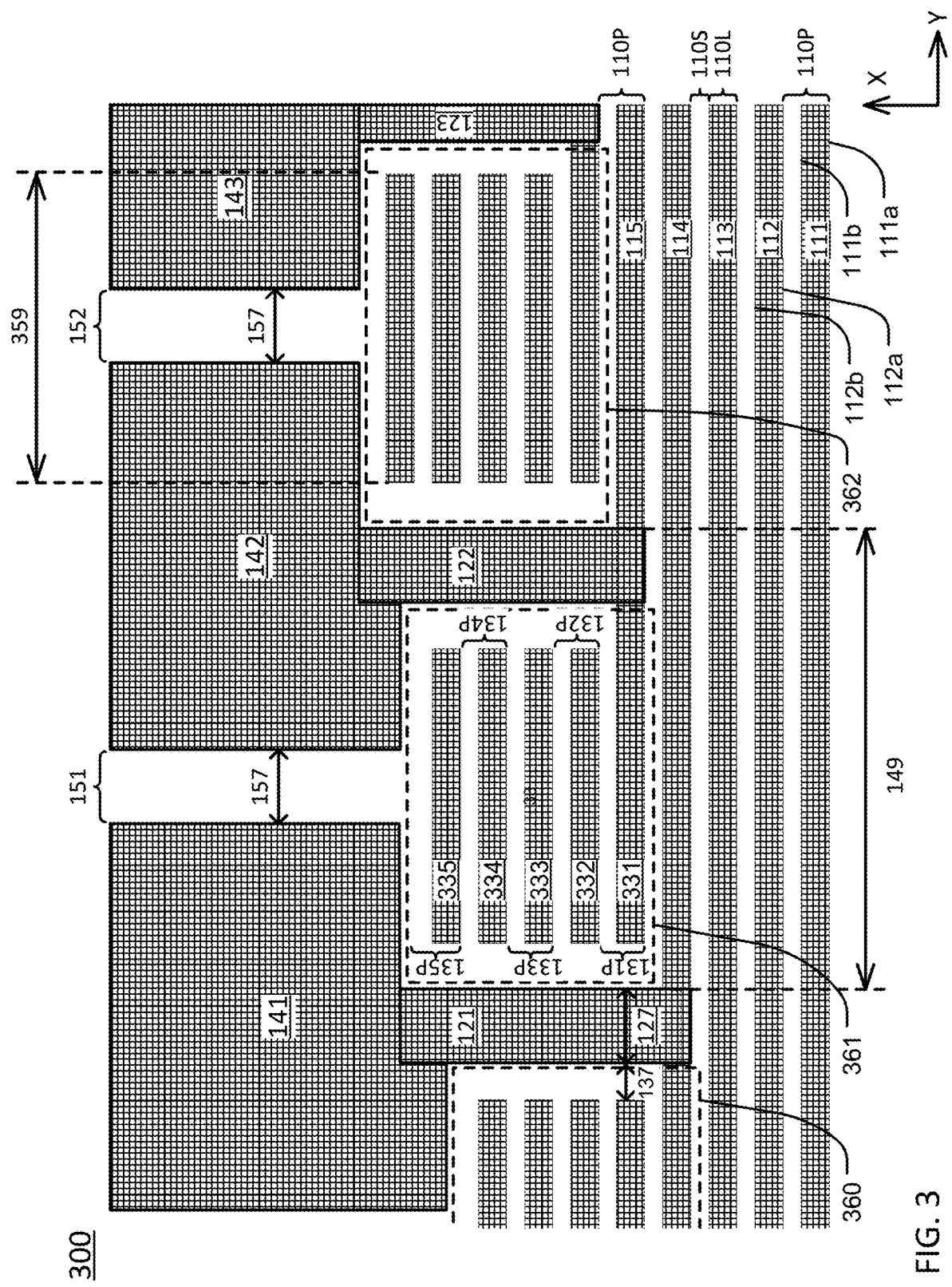
FIG. 3 illustrates a mask including a plurality of first mask lines, a plurality of mask areas, a plurality of mask linking lines, and a plurality of transition structures, in accordance with a second embodiment.

FIG. 3 illustrates a mask 300 including a plurality of first mask lines (111-115), a plurality of mask areas (141-143), a plurality of mask linking lines (121-123), and a plurality of transition structures (360-362), in accordance with a second embodiment. Description about like elements shown in FIG. 1 is applicable to like elements shown in FIG. 3 and not repeated here. The like elements include a plurality of first mask lines (111-115), a plurality of mask areas (141-143), a plurality of mask linking lines (121-123), and a plurality of pitches (131P-135P) of mask segments in a plurality of mask segments in a transition structure in the second direction (X-direction). A difference between the masks shown in FIGS. 1 and 3 is the arrangements of the mask segments in a transition structure.

A plurality of transition structures (e.g. 360, 361, 362) is disposed between respective pairs of mask linking lines (e.g. 121, 122). The transition structures each include a plurality of mask segments (331-335) extending in the first direction (Y-direction).

Transition structures in the plurality of transition structures (e.g. 361) have a transition structure pitch 149 in the first direction relative to adjacent transition structures in the plurality of transition structures. The mask segments in the plurality of mask segments (331-335) have lengths 359 extending a majority of the transition structure pitch in the first direction (Y-direction). As used herein, a majority of the transition structure pitch refers to more than 50% of the transition structure pitch. For instance, for a transition structure pitch of 800 nm, a majority of the transition structure pitch refers to more than 400 nm.

Mask segments in the plurality of mask segments (331-335) each have a first end (left end) and a second end (right end) opposite the first end in the first direction (Y-direction). The plurality of mask segments disposed between a pair of mask linking lines (121, 122) includes at least a mask segment (e.g. 335) separated at the first end from a first mask line 121 in the pair and separated at the second end from a mask linking line 122 in the pair.

Figure 5:
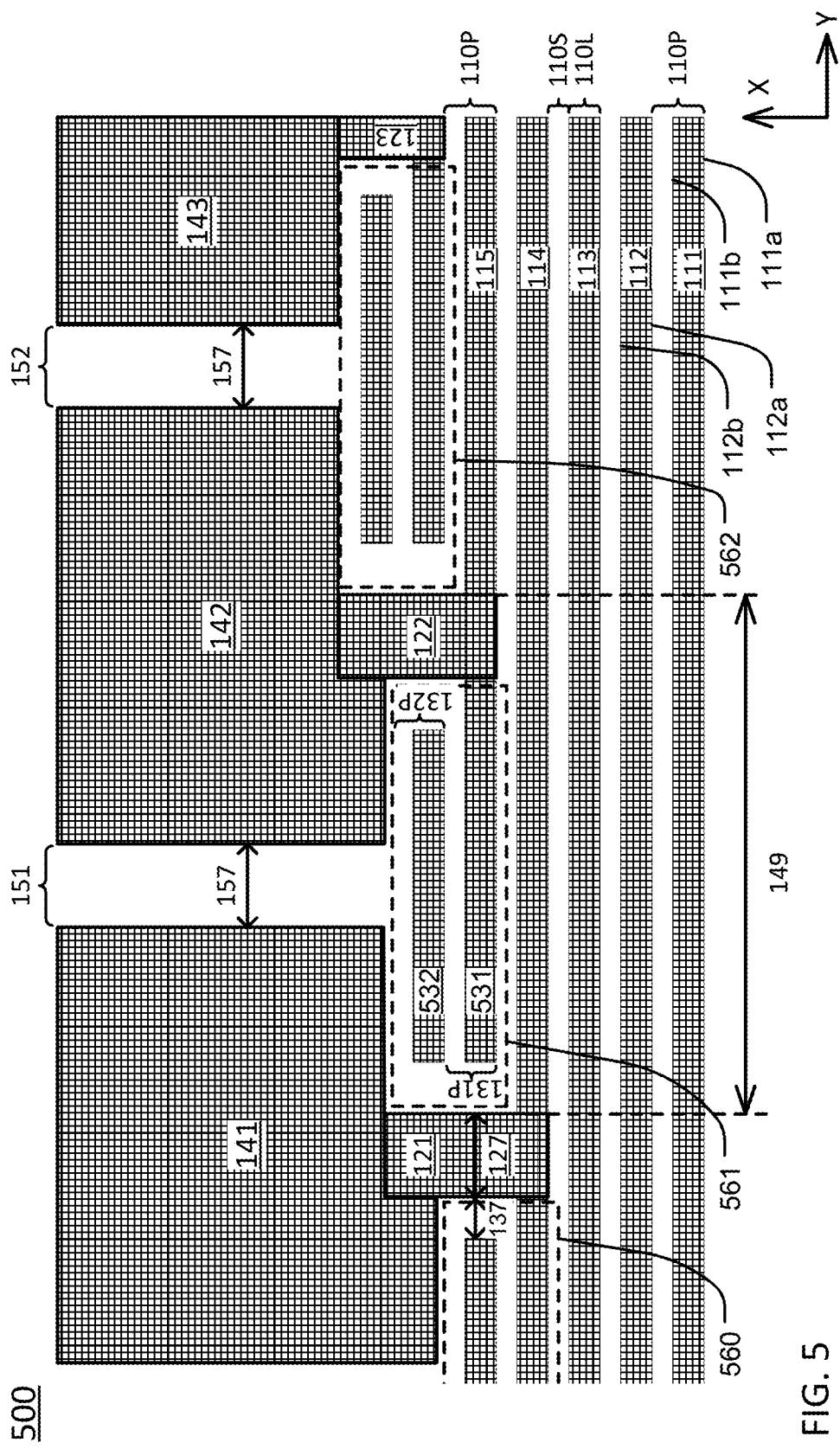
FIG. 5 illustrates a mask including a plurality of first mask lines, a plurality of mask areas, a plurality of mask linking lines, and a plurality of transition structures, in accordance with the second embodiment.
Figure 7:
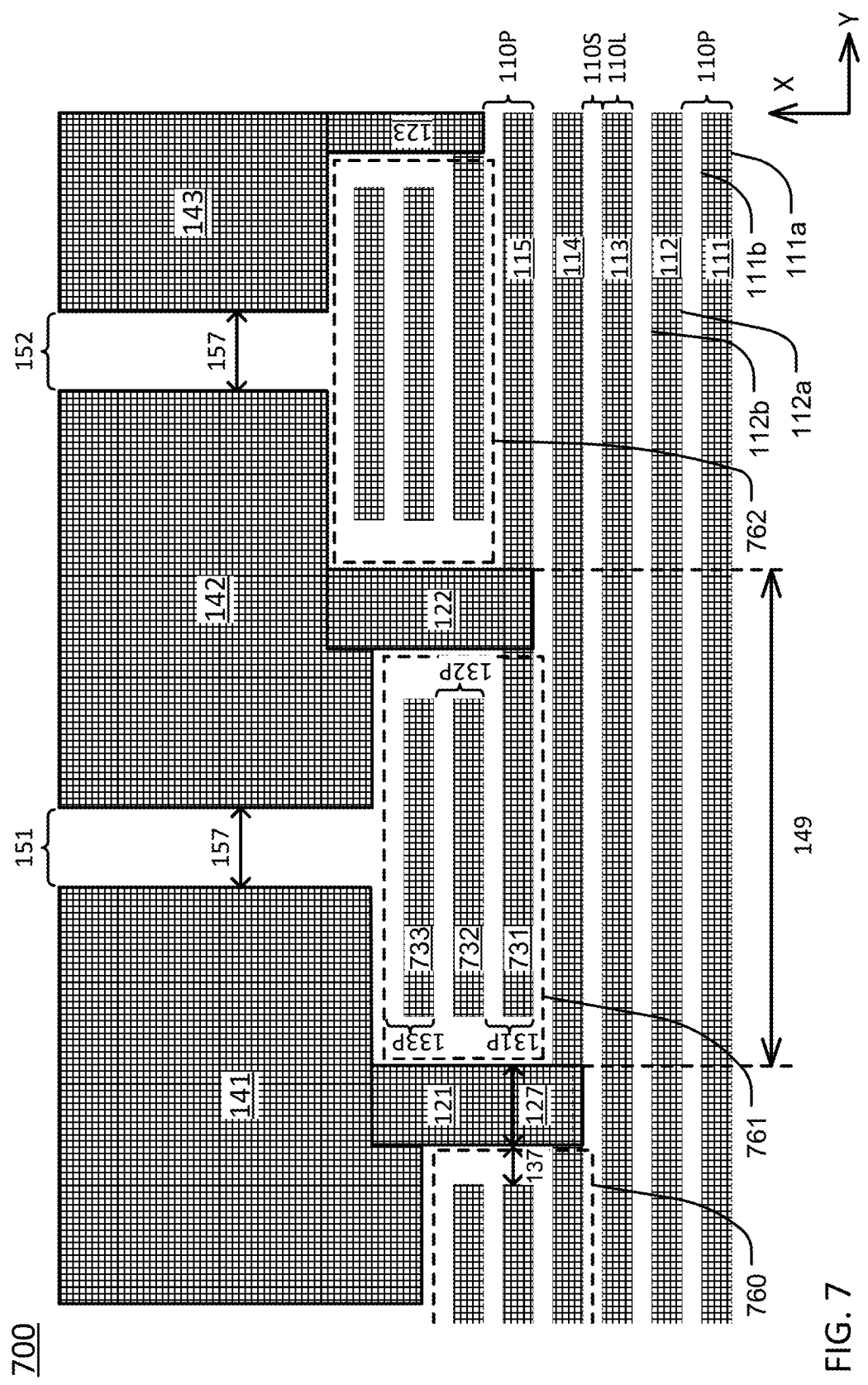
FIG. 7 illustrates a mask including a plurality of first mask lines, a plurality of mask areas, a plurality of mask linking lines, and a plurality of transition structures, in accordance with the second embodiment.

As shown in the example of FIG. 3, the plurality of mask segments disposed between a pair of mask linking lines (121-123) includes four mask segments (e.g. 332-335) separated at the first end from a first mask line 121 in the pair and separated at the second end from a mask linking line 122 in the pair. In comparison, as shown in the example of FIGS. 5 and 7, the plurality of mask segments disposed between a pair of mask linking lines (121, 122) can include a different number of mask segments separated at the first end from a first mask line 121 in the pair and separated at the second end from a mask linking line 122 in the pair.

Figure 4:
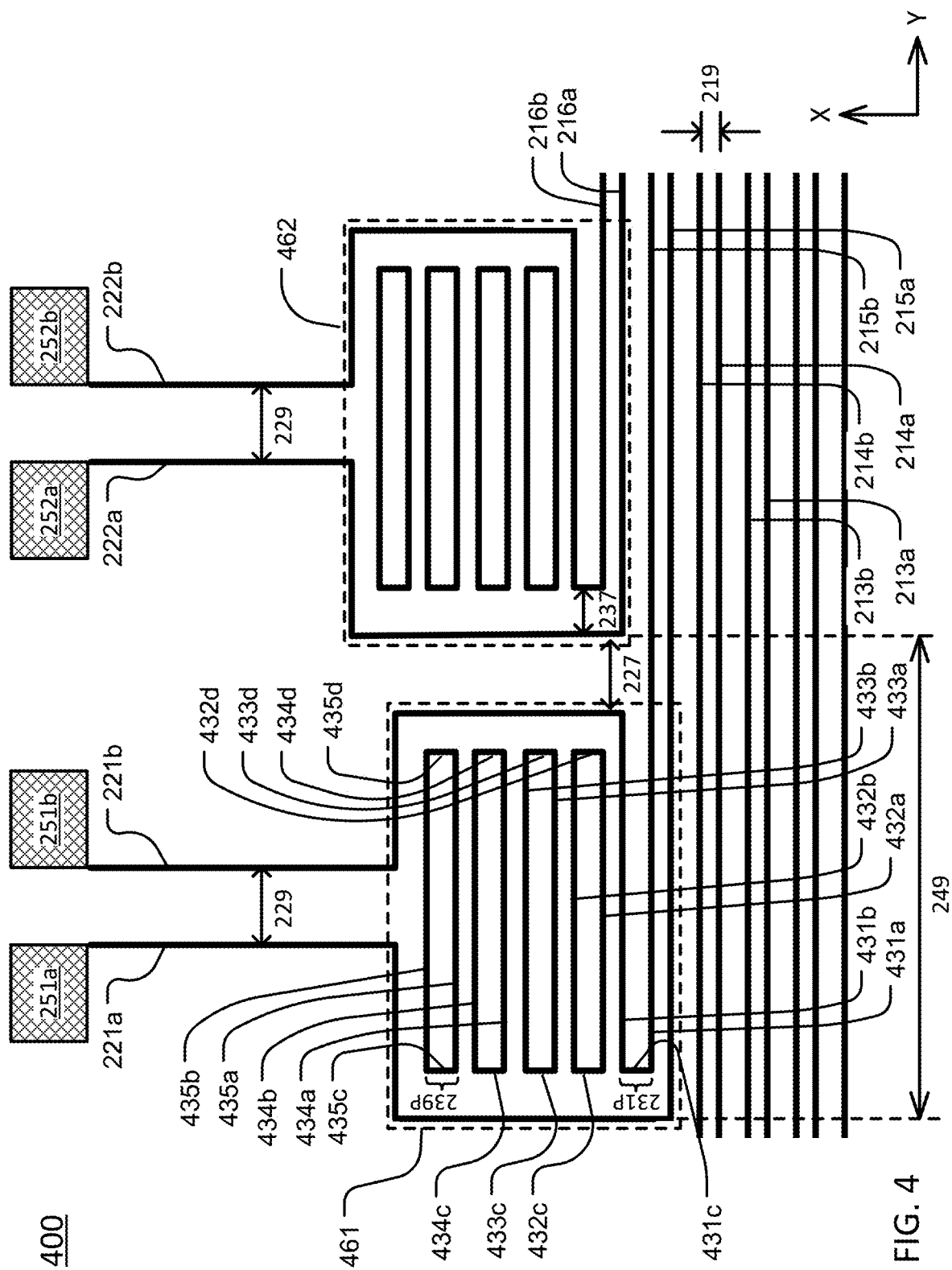
FIG. 4 illustrates an example circuit structure that can be manufactured using the mask as described in reference to FIG. 3.

FIG. 4 illustrates an example circuit structure 400 that can be manufactured using the mask as described in reference to FIG. 3. Description about like elements shown in FIG. 2 is applicable to like elements shown in FIG. 4 and not repeated here. The like elements include a plurality of first conducting lines (e.g. 215*a*, 215*b*, 216*a*, 216*b*), a plurality of linking lines (e.g. 221*a*, 221*b*, 222*a*, 222*b*), a transition pitch in a plurality of pitches (e.g. 231P, 239P) of segments in a plurality of segments in a plurality of connection structures, and a plurality of landing pads (251*a*, 251*b*, 252*a*, 252*b*). A difference between the circuit structures shown in FIG. 2 and FIG. 4 is the arrangements of the segments in a connection structure.

The circuit structure 400 comprises a plurality of connection structures (461, 462) connecting respective pairs of first conducting lines (215*a* and 215*b*, 216*a* and 216*b*) for current flow to respective pairs of linking lines (221*a* and 221*b*, 222*a* and 222*b*). The connection structures each include a plurality of segments (431*a*, 431*b*, 432*a*, 432*b*, 433*a*, 433*b*, 434*a*, 434*b*, 435*a*, 435*b*) extending in the first direction. Segments in the plurality of segments have a transition pitch (e.g. 239P) in the second direction relative to adjacent segments in the plurality of segments greater than or equal to the first pitch 219, and less than the second pitch 229.

Segments in the plurality of segments each have a first end and a second end opposite the first end in the first direction. The plurality of segments includes at least one pair of segments connected at the first end via a first segment in the second direction and connected at the second end via a second segment extending in the second direction. For example, segments 435*a* and 435*b* in a pair are connected at the first end via a first segment 435*c* in the second direction, and connected at the second end via a second segment 435*d* in the second direction. For example, pairs of segments 434*a* and 434*b*, 433*a* and 433*b*, and 432*a* and 432*b* are connected at the first end via first segment 434*c*, 433*c* and 432*c* in the second direction respectively, and connected at the second end via second segment 434*d*, 433*d* and 432*d* in the second direction respectively.

FIG. 5 illustrates a mask including a plurality of first mask lines (111-115), a plurality of mask areas (141-143), a plurality of mask linking lines (121-123), and a plurality of transition structures (560-562), in accordance with the second embodiment. Description about like elements shown in FIG. 3 is applicable to like elements shown in FIG. 5 and not repeated here. The like elements include a plurality of first mask lines (111-115), a plurality of mask areas (141-143), a plurality of mask linking lines (121, 122), and a plurality of pitches (131P, 132P) of mask segments in a plurality of mask segments in a transition structure in the second direction (X-direction).

A plurality of transition structures (e.g. 560, 561, 562) is disposed between respective pairs of mask linking lines (e.g. 121, 122). The transition structures each include a plurality of mask segments (531, 532) extending in the first direction (Y-direction).

A difference between the examples of FIGS. 3 and 5 is the number of mask segments disposed between a pair of mask linking lines (121, 122) that are separated at the first end from a first mask line 121 in the pair and separated at the second end from a mask linking line 122 in the pair.

As shown in the example of FIG. 5, the plurality of mask segments disposed between a pair of mask linking lines (121, 122) includes one mask segment (e.g. 532) separated at the first end from a first mask line 121 in the pair and separated at the second end from a mask linking line 122 in the pair. In comparison, as shown in the example of FIG. 3, the plurality of mask segments disposed between a pair of mask linking lines (121, 122) includes four mask segments (e.g. 332-335) separated at the first end from a first mask line 121 in the pair and separated at the second end from a mask linking line 122 in the pair.

Figure 6:
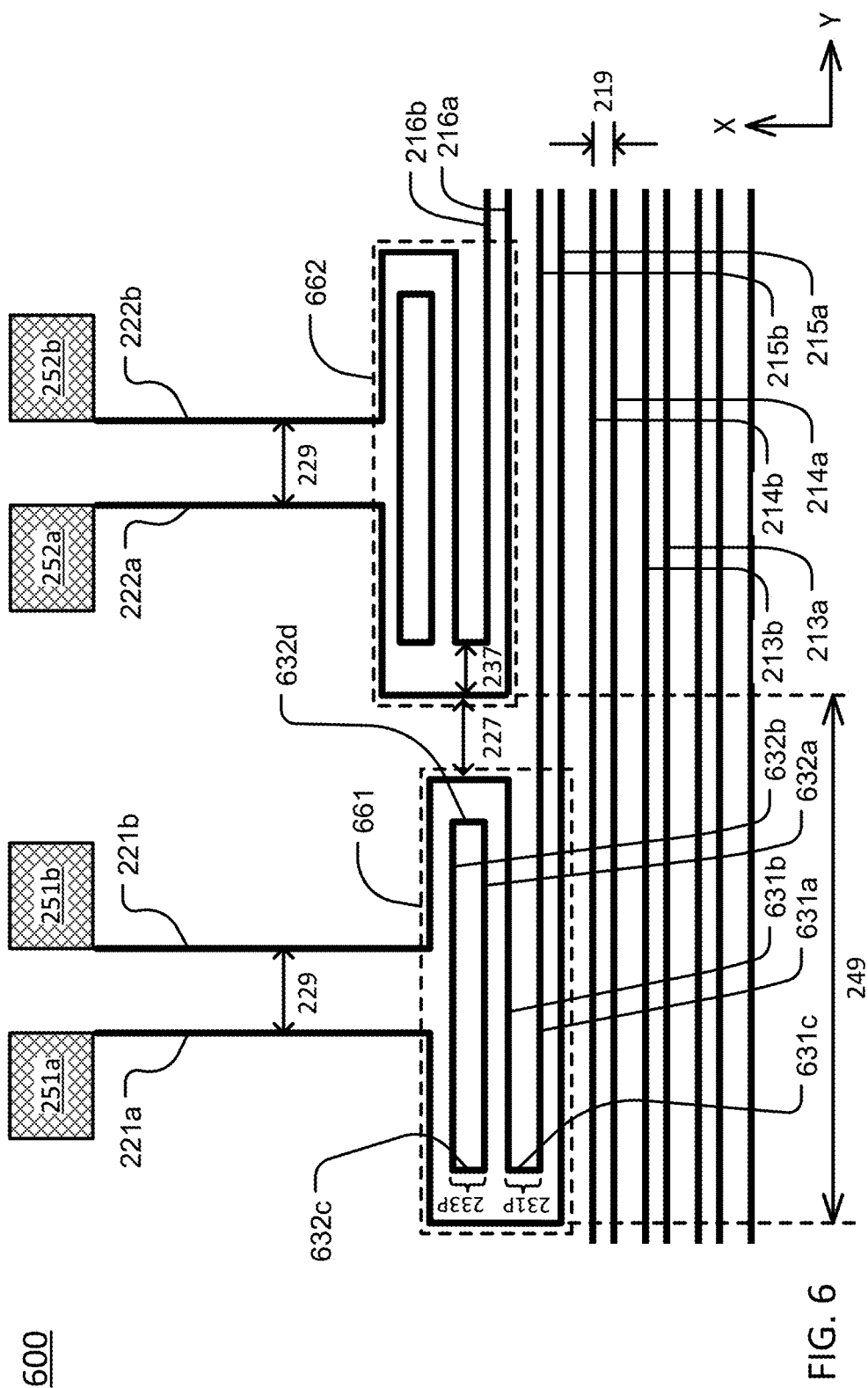
FIG. 6 illustrates an example circuit structure that can be manufactured using the mask as described in reference to FIG. 5.

FIG. 6 illustrates an example circuit structure 600 that can be manufactured using the mask as described in reference to FIG. 5. Description about like elements shown in FIG. 4 is applicable to like elements shown in FIG. 6 and not repeated here. A difference between the example circuit structures shown in FIG. 4 and FIG. 6 is the number of dummy structures in a connection structure. As used herein, a dummy structure in a connection structure comprises a pair of segments extending in the first direction that are connected at the first end via a first segment in the second direction and connected at the second end via a second segment extending in the second direction.

The circuit structure 600 comprises a plurality of connection structures (661, 662) connecting respective pairs of first conducting lines (215*a* and 215*b*, 216*a* and 216*b*) for current flow to respective pairs of linking lines (221*a* and 221*b*, 222*a* and 222*b*). The connection structures each include a plurality of segments (631*a*, 631*b*, 632*a*, 632*b*) extending in the first direction. Segments in the plurality of segments have a transition pitch (e.g. 233P) in the second direction relative to adjacent segments in the plurality of segments greater than or equal to the first pitch 219, and less than the second pitch 229.

Segments in the plurality of segments each have a first end and a second end opposite the first end in the first direction. As shown in the example of FIG. 6, the plurality of segments in a connection structure (e.g. 661) includes one pair of segments 632*a* and 632*b* connected at the first end via a first segment 632*c* in the second direction and connected at the second end via a second segment 632*d* extending in the second direction. In other words, the example of FIG. 6 illustrates one dummy structure in a connection structure (e.g. 661). In comparison, the example of FIG. 4 illustrates four dummy structures in a connection structure (e.g. 461). Both FIGS. 4 and 6 illustrate that a plurality of segments in a connection structure can include at least one pair of segments connected at the first end via a first segment in the second direction and connected at the second end via a second segment extending in the second direction.

FIG. 7 illustrates a mask including a plurality of first mask lines (111-115), a plurality of mask areas (141-143), a plurality of mask linking lines (121-123), and a plurality of transition structures (760-762) in accordance with the second embodiment. Description about like elements shown in FIG. 3 is applicable to like elements shown in FIG. 7 and not repeated here. The like elements include a plurality of first mask lines (111-115), a plurality of mask areas (141-143), a plurality of mask linking lines (121-123), and a plurality of pitches (131P, 132P, 133P) of mask segments in a plurality of mask segments in a transition structure in the second direction (X-direction).

A plurality of transition structures (e.g. 760, 761, 762) is disposed between respective pairs of mask linking lines (e.g. 121, 122). The transition structures each include a plurality of mask segments (731, 732, 733) extending in the first direction (Y-direction).

A difference between the examples of FIGS. 3 and 7 is the number of mask segments disposed between a pair of mask linking lines (121, 122) that are separated at the first end from a first mask line 121 in the pair and separated at the second end from a mask linking line 122 in the pair.

As shown in the example of FIG. 7, the plurality of mask segments disposed between a pair of mask linking lines (121, 122) includes two mask segment (e.g. 732, 733) separated at the first end from a first mask line 121 in the pair and separated at the second end from a mask linking line 122 in the pair. In comparison, as shown in the example of FIG. 3, the plurality of mask segments disposed between a pair of mask linking lines (121, 122) includes four mask segments (e.g. 332-225) separated at the first end from a first mask line 121 in the pair and separated at the second end from a mask linking line 122 in the pair.

FIGS. 3, 5 and 7 illustrate that the plurality of mask segments disposed between a pair of mask linking lines (121, 122) includes at least a mask segment separated at the first end from a first mask line 121 in the pair and separated at the second end from a mask linking line 122 in the pair.

Figure 8:
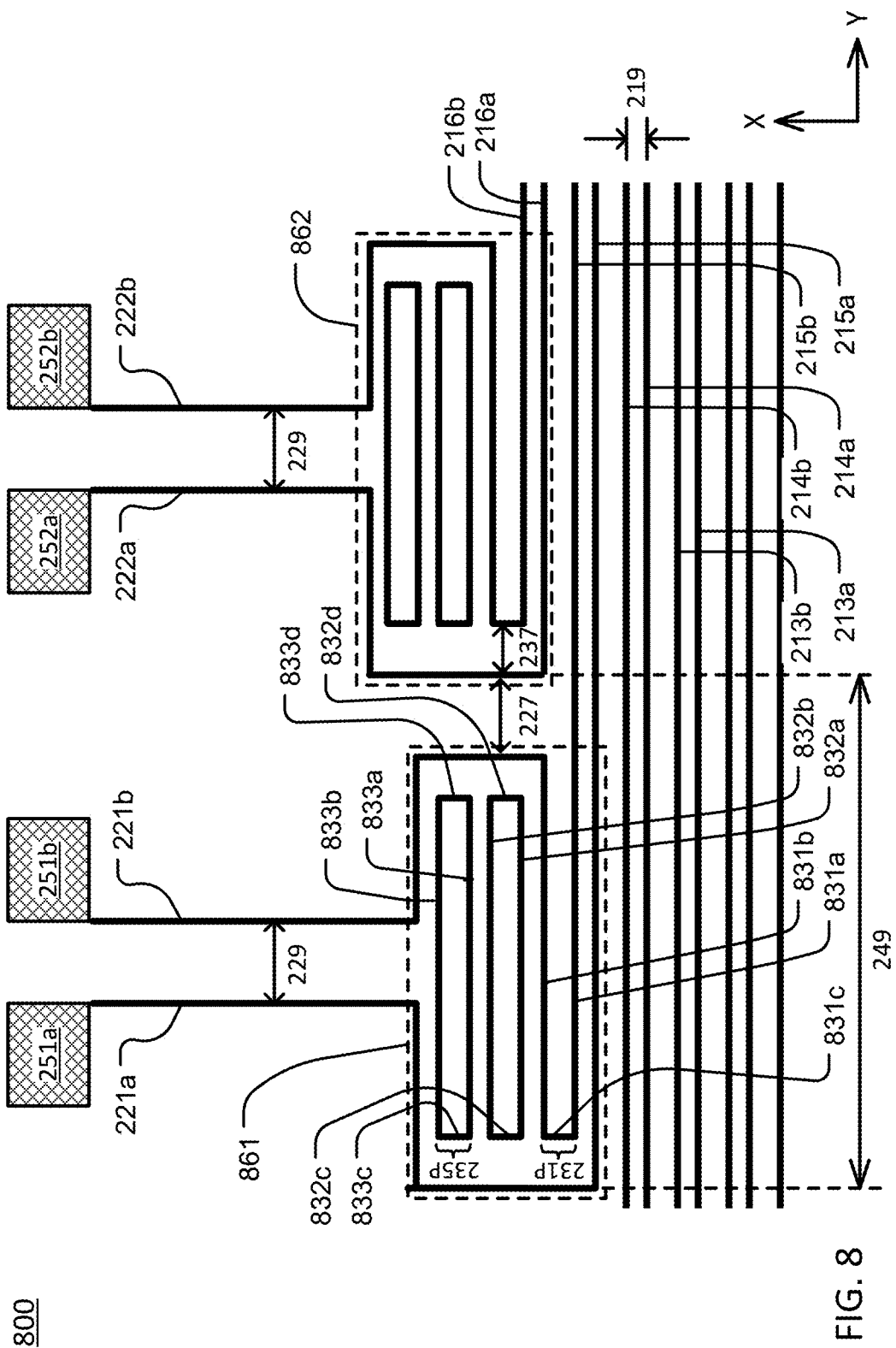
FIG. 8 illustrates an example circuit structure that can be manufactured using the mask as described in reference to FIG. 7.

FIG. 8 illustrates an example circuit structure 800 that can be manufactured using the mask as described in reference to FIG. 7. Description about like elements shown in FIG. 4 is applicable to like elements shown in FIG. 8 and not repeated here. A difference between the example circuit structures shown in FIG. 4 and FIG. 8 is the number of dummy structures in a connection structure. As used herein, a dummy structure in a connection structure comprises a pair of segments extending in the first direction that are connected at the first end via a first segment in the second direction and connected at the second end via a second segment extending in the second direction.

The circuit structure 800 comprises a plurality of connection structures (861, 862) connecting respective pairs of first conducting lines (215*a* and 215*b*, 216*a* and 216*b*) for current flow to respective pairs of linking lines (221*a* and 221*b*, 222*a* and 222*b*). The connection structures each include a plurality of segments (831*a*, 831*b*, 832*a*, 832*b*, 833*a*, 833*b*) extending in the first direction. Segments in the plurality of segments have a transition pitch (e.g. 235P) in the second direction relative to adjacent segments in the plurality of segments greater than or equal to the first pitch 219, and less than the second pitch 229.

Segments in the plurality of segments each have a first end and a second end opposite the first end in the first direction. As shown in the example of FIG. 8, the plurality of segments in a connection structure (e.g. 861) includes a first pair of segments 832a and 832b connected at the first end via a first segment 832c in the second direction and connected at the second end via a second segment 832d extending in the second direction, and a second pair of segments 833a and 833b connected at the first end via a first segment 833c in the second direction and connected at the second end via a second segment 833d extending in the second direction. In other words, the example of FIG. 8 illustrates two dummy structures in a connection structure (e.g. 861). In comparison, the example of FIG. 4 illustrates four dummy structures in a connection structure (e.g. 461). Both FIGS. 4 and 8 illustrate that a plurality of segments in a connection structure can include at least one pair of segments connected at the first end via a first segment in the second direction and connected at the second end via a second segment extending in the second direction.

Figure 9:
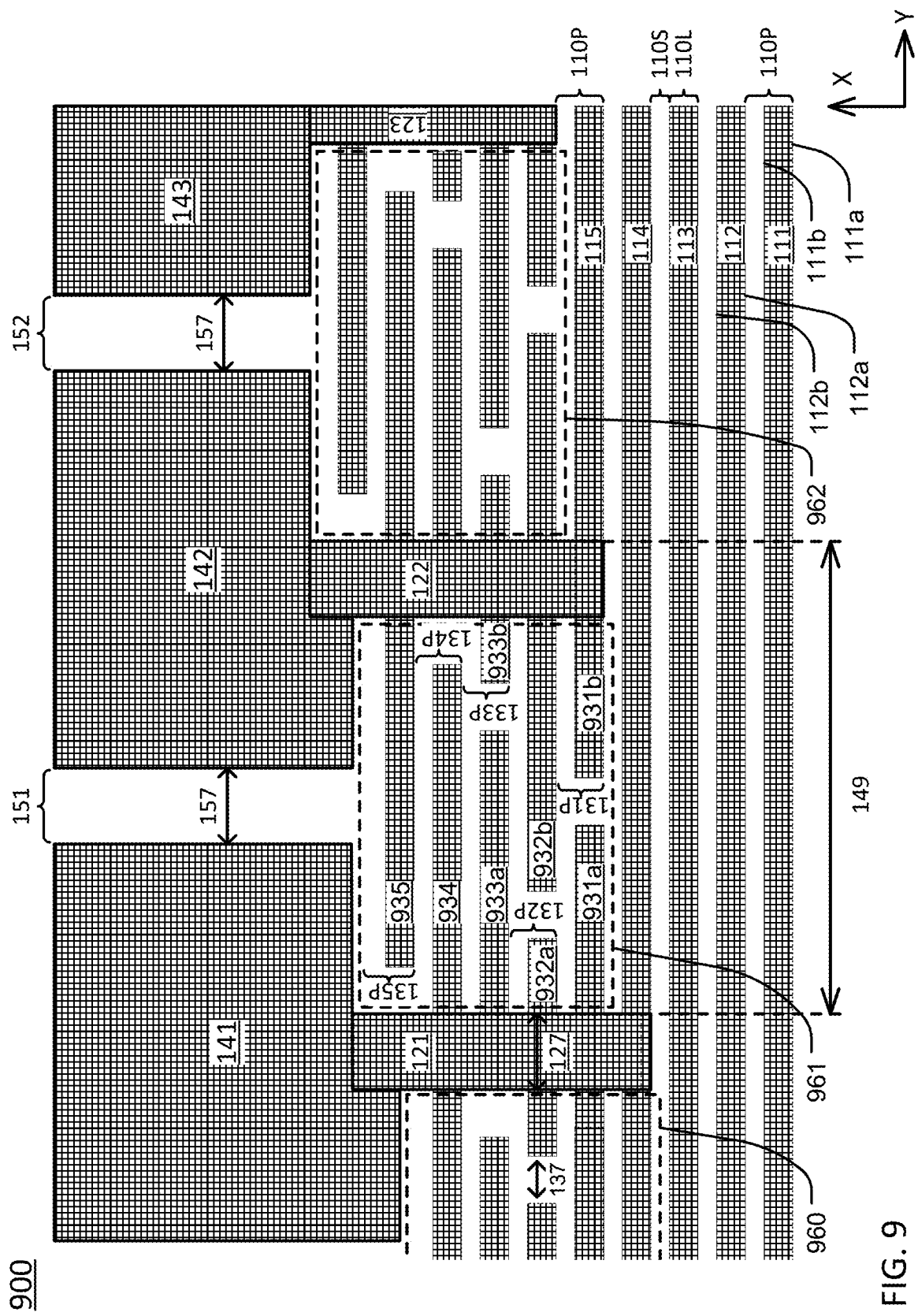
FIG. 9 illustrates a mask including a plurality of first mask lines, a plurality of mask areas, a plurality of mask linking lines, and a plurality of transition structures, in accordance with a third embodiment.

FIG. 9 illustrates a mask including a plurality of first mask lines (111-115), a plurality of mask areas (141-143), a plurality of mask linking lines (121-123), and a plurality of transition structures (960-962), in accordance with a third embodiment. Description about like elements shown in FIG. 1 is applicable to like elements shown in FIG. 9 and not repeated here. The like elements include a plurality of first mask lines (111-115), a plurality of mask areas (141-143), a plurality of mask linking lines (121-123), and a plurality of pitches (131P-135P) of mask segments in a plurality of mask segments in a transition structure.

A plurality of transition structures (e.g. 960, 961, 962) is disposed between respective pairs of mask linking lines (e.g. 121, 122, 123). The transition structures each include a plurality of mask segments (931a, 931b, 932a, 932b, 933a, 933b, 934, 935) extending in the first direction (Y-direction). Mask segments in the plurality of mask segments have a transition pitch (e.g. 131P-135P) in the second direction (X-direction) as described in reference to FIG. 1.

Mask segments in the plurality of mask segments each have a first end (left end) and a second end (right end) opposite the first end in the first direction (Y-direction). The plurality of mask segments disposed between a pair of mask linking lines (e.g. 121, 122) includes a first set of mask segments (931a, 932a, 933a) connected at the first end to a first mask line 121 in the pair and not aligned at the second end, and a second set of mask segments (931b, 932b, 933b) connected at the second end to the mask linking line 122 in the pair and not aligned at the first end. Mask segments in the first set of mask segments (931a, 932a, 933a) are aligned with respective mask segments in the second set of mask segments (931b, 932b, 933b) in the second direction (X-direction).

Transition structures in the plurality of transition structures (e.g. 961) have a transition structure pitch 149 in the first direction (X-direction) relative to adjacent transition structures in the plurality of transition structures. A sum of a first length of a first mask segment (e.g. 931a) in the first set of mask segments and a second length of a second mask segment (e.g. 931b) in the second set of mask segment aligned with the first mask segment in the second direction (Y-direction) can extend a majority of the transition structure pitch 149 in the first direction (Y-direction). As used herein, a majority of the transition structure pitch refers to more than 50% of the transition structure pitch. For instance, for a transition structure pitch of 800 nm, a majority of the transition structure pitch refers to more than 400 nm.

A first mask segment (e.g. 932a) in the first set of mask segments and a second mask segment (e.g. 932b) in the second set of mask segment aligned with the first mask segment in the second direction are separated from each other by a gap width 137. In one embodiment, a sum of the gap width 137 and the mask line width 127 can be greater than the mask line pitch 110P and less than four times the mask line pitch 110P. For example, the gap width 137 can have a range of about 30 nm to 100 nm, the mask line width 127 can have a range of about 100 nm to 150 nm, and the mask line pitch 110P can be 78 nm. In this example, a sum of the gap width 137 and the mask line width 127 can have a range of about 130 nm to 250 nm, which is greater than the mask line pitch 110P of 78 nm and less than four times the mask line pitch 110P.

Figure 10:
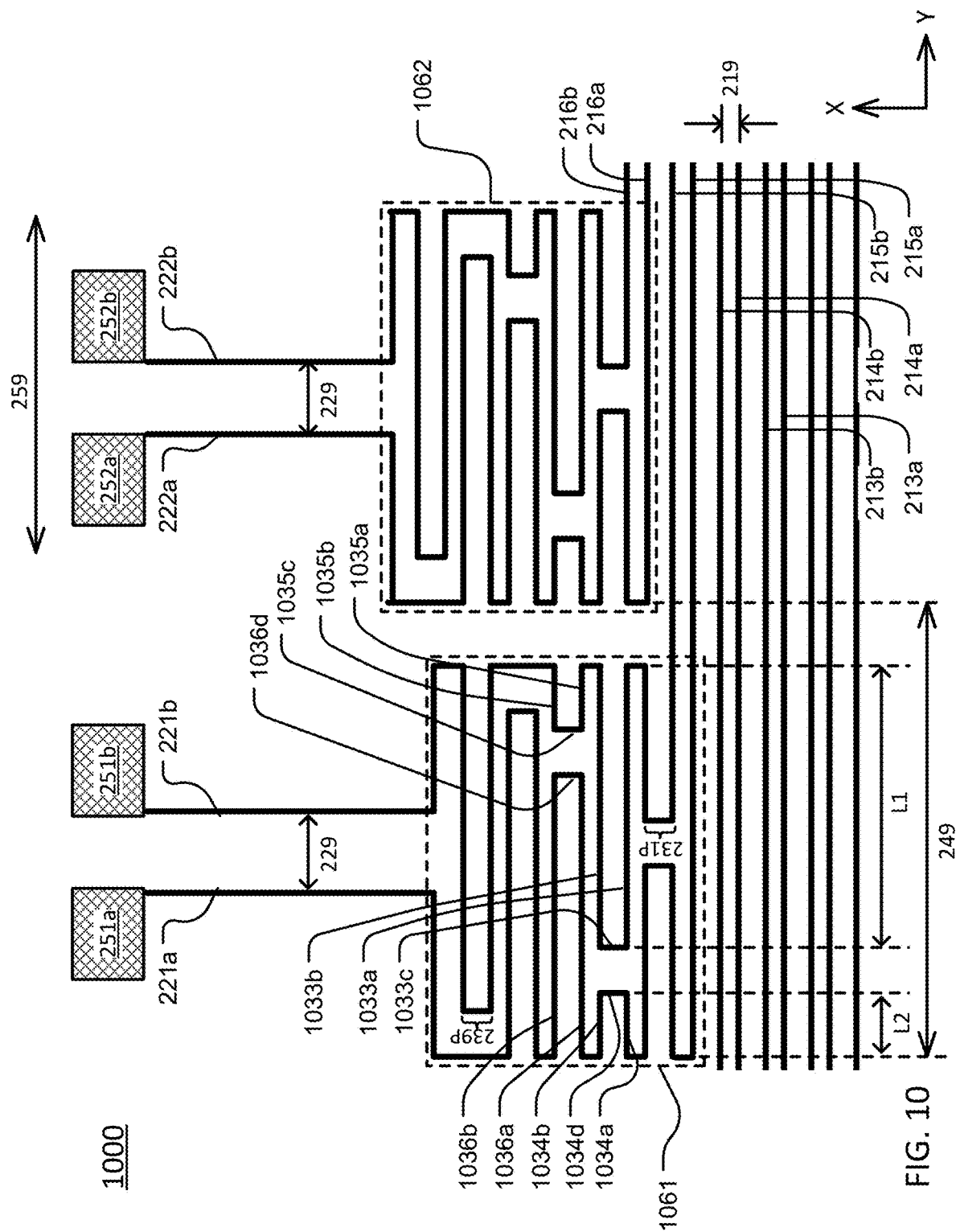
FIG. 10 illustrates an example circuit structure that can be manufactured using the mask as described in reference to FIG. 9.

FIG. 10 illustrates an example circuit structure 1000 that can be manufactured using the mask as described in reference to FIG. 9. Description about like elements shown in FIG. 2 is applicable to like elements shown in FIG. 10 and not repeated here. The like elements include a plurality of first conducting lines (e.g. 213a, 213b, 2154a, 214b, 215a, 215b, 216a, 216b), a plurality of linking lines (e.g. 221a, 221b, 222a, 222b), a transition pitch in a plurality of pitches (e.g. 231P, 239P) of segments in a plurality of segments in a plurality of connection structures, and a plurality of landing pads (251a, 251b, 252a, 252b). A difference between the circuit structures shown in FIG. 2 and FIG. 10 is the arrangements of the segments in a connection structure.

The circuit structure 1000 comprises a plurality of connection structures (1061, 1062) connecting respective pairs of first conducting lines (215a and 215b, 216a and 216b) for current flow to respective pairs of linking lines (221a and 221b, 222a and 222b). The connection structures each include a plurality of segments (1033a, 1033b, 1034a, 1034b, 1035a, 1035b, 1036a, 1036b) extending in the first direction. Segments in the plurality of segments have a transition pitch (e.g. 239P) in the second direction relative to adjacent segments in the plurality of segments greater than or equal to the first pitch 219, and less than the second pitch 229.

Segments in the plurality of segments each have a first end (left end) and a second end (right end) opposite the first end in the first direction. As shown as shown in the example of FIG. 10, the plurality of segments includes a first set of pairs of segments (e.g. 1033a and 1033b, 1035a and 1035b) aligned at the second end and each connected at the first end via respective first segments (e.g. 1033c, 1035c) extending in the second direction. The plurality of segments includes a second set of pairs of segments (e.g. 1034a and 1034b, 1036a and 1036b) aligned at the first end and each connected at the second end via respective second segments (e.g. 1034d, 1036d) extending in the second direction. The first and second segments extending in the second direction (e.g. 1033c, 1034d, 1035c, 1036d) are not aligned in the first direction.

Connection structures in the plurality of connection structures have a connection structure pitch 249 in the first direction relative to adjacent connection structures (e.g. 1061, 1062) in the plurality of connection structures. A sum of a first length L1 of a first pair of segments (e.g. 1033a, 1033b) in the first set of pairs of segments and a second length L2 of a second pair of segments (e.g. 1034a, 1034b)

in the second set of pairs of segments aligned with the first pair of segments in the second direction can extend a majority of the connection structure pitch 249.

Figure 11A:
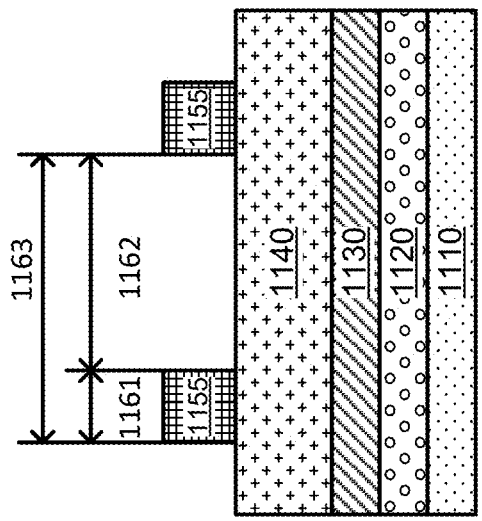
FIGS. 11A-11G illustrate example manufacturing steps in a self-aligned double patterning process using a mask as described in reference to FIG. 1 to result in a circuit structure as described in reference to FIG. 2.

FIGS. 11A-11G illustrate example manufacturing steps in a self-aligned double patterning process using a mask as described in reference to FIG. 1 to result in a circuit structure as described in reference to FIG. 2. FIG. 11A illustrates a cross-section of a substrate taken at line AA' in the second direction through a plurality of first mask lines (111-114) and a plurality of mask segments (131-135) in a transition structure (161) in a mask 100 as shown in FIG. 1. The manufacturing steps are applicable to a self-aligned double patterning process using a mask as described in reference to FIGS. 3, 5, 7, 9 to result in a circuit structure as described in reference to FIG. 2, 4, 6, 8, 10, respectively.

Although the substrate can be many suitable combinations of materials, the substrate in this example can have layers of materials including, from top to bottom, a layer of sacrificial material 1140 such as APF (Advanced Patterning Film) comprising amorphous carbon, a layer of hard mask material 1130 such as TiN, and a layer of conductive material 1120 such as polysilicon, and a layer of insulating material 1110 such as SiO2. Mask lines 1150 are formed on the substrate, and are representative of a plurality of first mask lines and a plurality of mask segments in a transition structure as described in reference to FIG. 1.

Figure 11B:
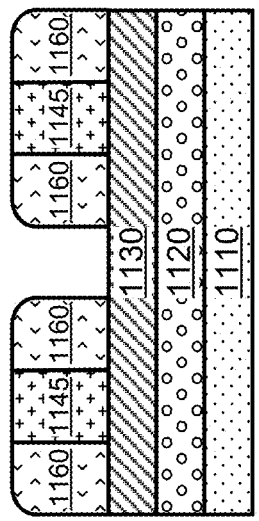

FIG. 11B illustrates the result of trimming the mask lines 1150 to result in trimmed mask lines 1155 having a 1:3 ratio of a mask line width 1161 over a mask space width 1162 between two adjacent trimmed mask lines. A mask line pitch 1163 can include the mask line width 1161 and the mask space width 1162.

Figure 11C:
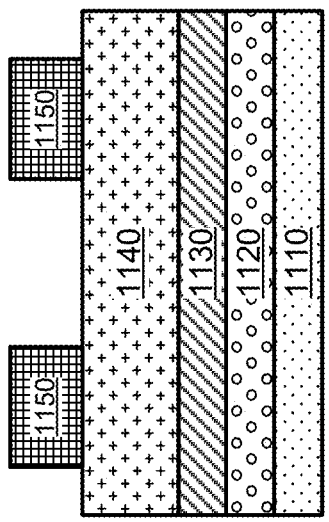

FIG. 11C illustrates the result of etching the layer of sacrificial material 1140 using the mask (e.g. 100, FIG. 1) as described herein including the trimmed mask lines 1155, stopping at the layer of hard mask material 1130, and then removing the mask. The etching step results in a sacrificial pattern including sacrificial lines 1145.

Figure 11D:
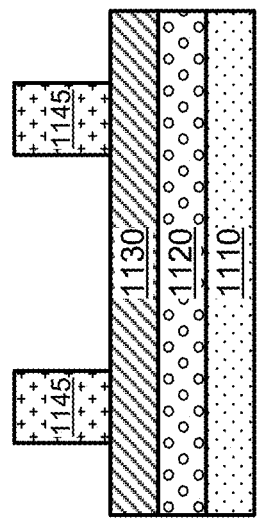

FIG. 11D illustrates the result of forming sidewall spacers 1160 on the sacrificial pattern including the sacrificial lines 1145 on the layer of hard mask material 1130. This step can include depositing a layer of spacer material such as a low temperature oxide over the partially manufactured circuit structure including the sacrificial lines 1145, using a method such as chemical vapor deposition. The layer of spacer material can then be etched to form sidewall spacers 1160 on the sacrificial lines 1145.

Figure 11F:
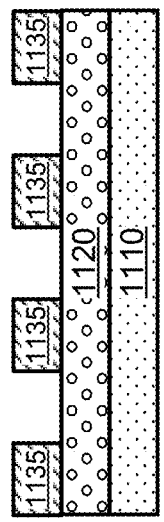
Figure 11E:
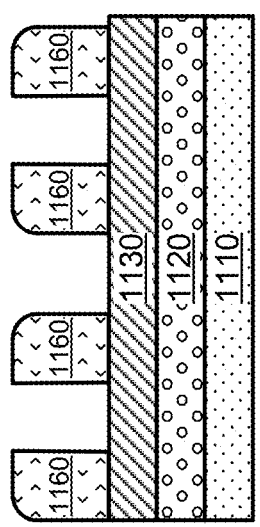

FIG. 11E illustrates the result of removing the sacrificial pattern including sacrificial lines 1145 after the sidewall spacers 1160 are formed on the sacrificial lines 1145. After the sacrificial pattern is removed, the sidewall spacers 1160 remain on the layer of hard mask material 1130.

FIG. 11F illustrates the result of etching the layer of hard mask material 1130 using the sidewall spacers 1160 as an etch mask to form a hard mask 1135. The sidewall spacers 1160 are removed during the process to form the hard mask 1135.

Figure 11G:
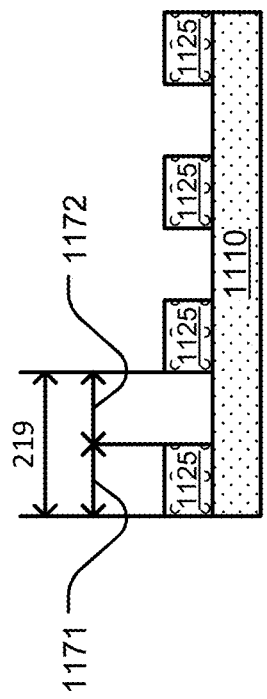

FIG. 11G illustrates the result of etching the layer of conductive material 1120 using the hard mask 1135 to form conducting lines 1125, such as the plurality of first conducting lines and a plurality of segments in the connection structures as described in reference to FIG. 2. The first pitch 219 as described in reference to FIG. 2 can include a line width 1171 of the conducting lines 1125 and a space width 1172 between two adjacent conducting lines.

Figure 12:
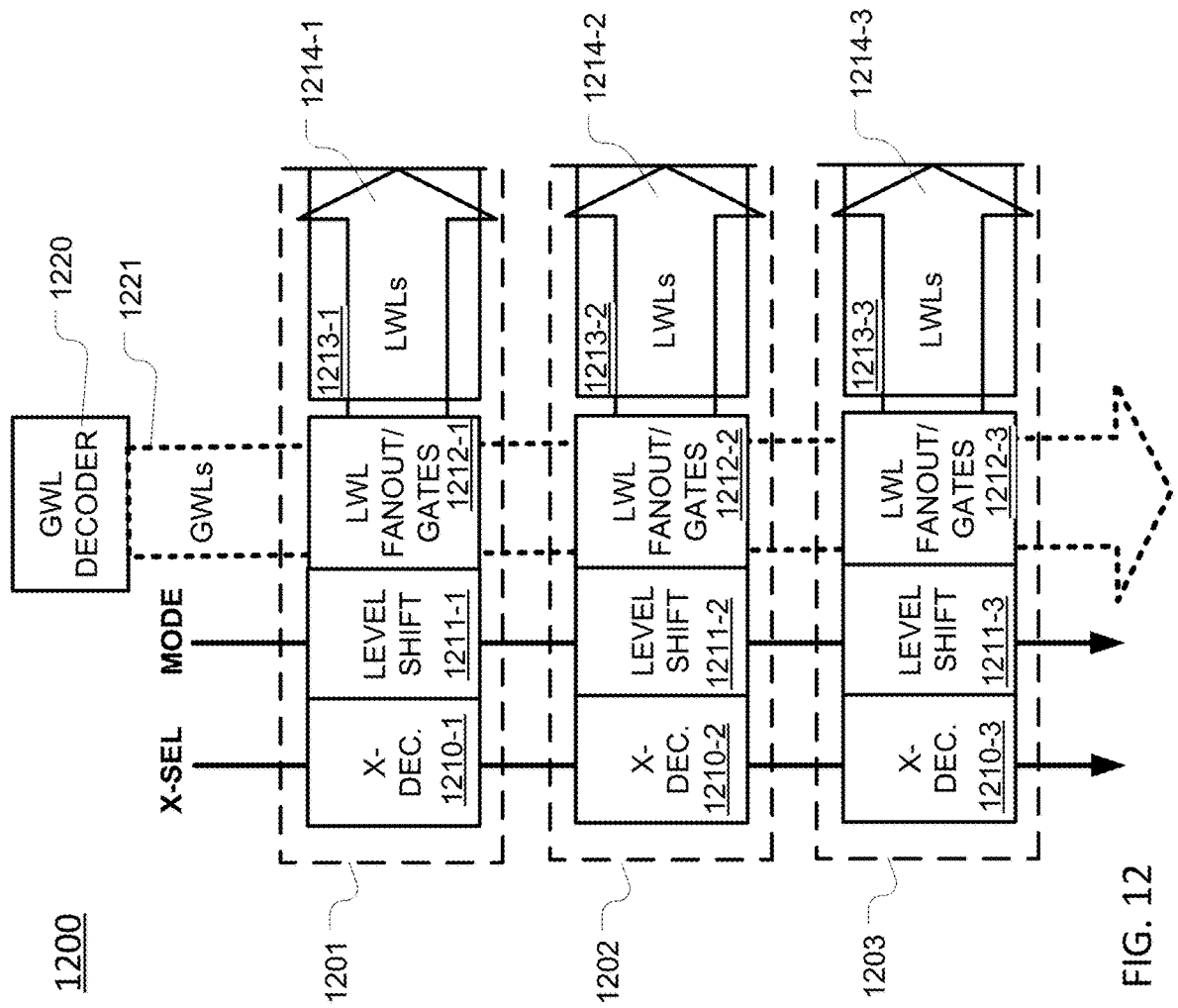
FIG. 12 is a schematic diagram of a plurality of blocks of memory cells in a memory array including local word line/global word line structures.

FIG. 12 is a schematic diagram of a plurality of blocks of memory cells in a memory array including local word line/global word line structures. One example of a local word line/global word line structure is described in U.S. Pat. No. 9,330,764 B2, entitled Array Fanout Pass Transistor Structure, by Lin et al., issued May 3, 2016, which application is incorporated by reference as if fully set forth herein.

As shown in the example of FIG. 12, a circuit structure 1200 comprises a plurality of blocks of memory cells (1201-1203), blocks in the plurality of blocks including the first conducting lines (e.g. 215a, 215b, FIG. 2) configured as respective local word lines (1214-1, 1214-2, 1214-3). The circuit structure 1200 comprises a plurality of fanout structures (e.g. 1212-1, 1212-2, 1212-3), fanout structures in the plurality of fanout structures including respective connection structures (e.g. 261, FIG. 2) and respective linking lines (e.g. 221a, 221b, FIG. 2). The circuit structure 1200 comprises a plurality of landing pads (e.g. 251a, 251b, FIG. 2), landing pads in the plurality of landing pads connected to the respective linking lines (e.g. 221a, 221b, FIG. 2). The circuit structure 1200 comprises a plurality of global word lines (1221), global word lines in the plurality of global word lines connected to respective landing pads.

Block 1201 includes X-DEC (X-Decoder) circuit 1210-1, level shifter 1211-1, local word line fanout structure 1212-1, including pass transistors, and a set 1214-1 of local word lines which extend through a subarray 1213-1 of memory cells. Block 1202 includes X-DEC circuit 1210-2, level shifter 1211-2, local word line fanout structure 1212-2, including pass transistors, and a set 1214-2 of local word lines which extend through a subarray 1213-2. Block 1203 includes X-DEC circuit 1210-3, level shifter 1211-3, local word line fanout structure 1212-3, including pass transistors, and a set 1214-3 of local word lines which extend through a subarray 1213-3.

A global word line decoder 1220 generates word line voltages for a set of global word lines 1221 which extend through the array to the local word line fanout structures 1212-1, 1212-2, 1212-3, in all or some of the blocks in the array. The X-DEC circuits (e.g. 1210-3) receive block select signals X-SEL from the block decoder on the integrated circuit, and control enabling the connection of the global word lines to the selected blocks. The level shifters (e.g. 1211-3) are used to produce control signals for the pass transistors in the fanout structure, such that the gate voltages on the pass transistors are sufficiently high relative to the word line voltages supplied on the global word lines to turn on the pass transistors in selected blocks.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit structure comprising:
   a plurality of first conducting lines extending in a first direction, the first conducting lines having a first pitch in a second direction orthogonal to the first direction;
   a plurality of linking lines extending in the second direction, the linking lines having a second pitch in the first direction, the second pitch being greater than the first pitch; and
   a plurality of connection structures connecting respective first conducting lines for current flow to respective linking lines, the connection structures each including a plurality of segments extending in the first direction, segments in the plurality of segments having a transition pitch in the second direction relative to adjacent segments in the plurality of segments greater than or equal to the first pitch, and less than the second pitch.

2. The circuit structure of claim 1, segments in the plurality of segments having a plurality of pitches, wherein the transition pitch between two segments in the plurality of pitches proximal to the linking lines is larger than the transition pitch between two segments in the plurality of pitches proximal to the first conducting lines.

3. The circuit structure of claim 2, wherein the pitches in the plurality of pitches increase with distances of the segments in the plurality of segments away from the first conducting lines.

4. The circuit structure of claim 1, wherein connection structures in the plurality of connection structures have a connection structure pitch in the first direction, and the segments in the plurality of segments have lengths extending a majority of the connection structure pitch.

5. The circuit structure of claim 1,
adjacent connection structures in the plurality of connection structures being offset by twice the first pitch in the second direction; and
adjacent pairs of first conducting lines in the plurality of first conducting lines terminating at respective adjacent connection structures in the plurality of connection structures.

6. The circuit structure of claim 1, wherein
segments in the plurality of segments each have a first end and a second end opposite the first end in the first direction; and
the plurality of segments includes a first set of pairs of segments each connected at the first end via respective first segments extending in the second direction, and a second set of pairs of segments each connected at the second end via respective second segments extending in the second direction,
the pairs of segments in the first set being interdigitated with the pairs of segments in the second set in the second direction.

7. The circuit structure of claim 1, wherein
segments in the plurality of segments each have a first end and a second end opposite the first end in the first direction; and
the plurality of segments includes at least one pair of segments connected at the first end via a first segment in the second direction and connected at the second end via a second segment extending in the second direction.

8. The circuit structure of claim 1, wherein
segments in the plurality of segments each have a first end and a second end opposite the first end in the first direction; and
the plurality of segments includes a first set of pairs of segments aligned at the second end and each connected at the first end via respective first segments extending in the second direction, and a second set of pairs of segments aligned at the first end and each connected at the second end via respective second segments extending in the second direction,
the first and second segments extending in the second direction being not aligned in the first direction.

9. The circuit structure of claim 8, wherein connection structures in the plurality of connection structures have a connection structure pitch in the first direction relative to adjacent connection structures in the plurality of connection structures, a sum of a first length of a first pair of segments in the first set of pairs of segments and a second length of a second pair of segments in the second set of pairs of segments aligned with the first pair of segments in the second direction extending a majority of the connection structure pitch.

10. The circuit structure of claim 1, comprising:
a plurality of blocks of memory cells, blocks in the plurality of blocks including the first conducting lines configured as respective local word lines;
a plurality of fanout structures, fanout structures in the plurality of fanout structures including respective connection structures and respective linking lines;
a plurality of landing pads, landing pads in the plurality of landing pads connected to the respective linking lines; and
a plurality of global word lines, global word lines in the plurality of global word lines connected to respective landing pads.

11. A method of manufacturing a circuit structure, comprising:
forming a mask over a substrate, the mask including:
a plurality of first mask lines extending in a first direction, the first mask lines having a mask line pitch in a second direction orthogonal to the first direction;
a plurality of mask areas separated by mask area gaps having a mask area gap width in the first direction greater than the mask line pitch;
a plurality of mask linking lines extending in the second direction having a mask line width greater than the mask line pitch and less than twice the mask line pitch, the mask linking lines connecting respective mask areas to respective first mask lines; and
a plurality of transition structures disposed between respective pairs of mask linking lines, the transition structures each including a plurality of mask segments extending in the first direction, mask segments in the plurality of mask segments having a mask transition pitch in the second direction relative to adjacent mask segments in the plurality of mask segments greater than or equal to the mask line pitch, and less than the mask area gap width; and
executing a self-aligned double patterning process on the substrate using the mask to form a circuit structure comprising:
a plurality of first conducting lines extending in the first direction, the first conducting lines having a first pitch in the second direction orthogonal to the first direction;
a plurality of linking lines extending in the second direction, the linking lines having a second pitch in the first direction, the second pitch being greater than the first pitch; and
a plurality of connection structures connecting respective first conducting lines for current flow to respective linking lines, the connection structures each including a plurality of segments extending in the first direction, segments in the plurality of segments having a transition pitch in the second direction relative to adjacent segments in the plurality of segments greater than or equal to the first pitch, and less than the second pitch.

12. The method of claim 11, mask segments in the plurality of mask segments having a plurality of mask transition pitches, wherein the mask transition pitch between two segments in the plurality of pitches proximal to the mask areas is larger than the mask transition pitch between two segments in the plurality of pitches proximal to the first mask lines.

13. The method of claim 12, wherein the pitches in the plurality of pitches increase with distances of the mask segments in the plurality of mask segments away from the first mask lines.

14. The method of claim 12, wherein
a mask area in the plurality of mask areas has a first side parallel to and proximal to mask segments in the plurality of mask segments;
the plurality of mask segments includes an adjacent mask segment to the first side of the mask area, the adjacent mask segment having a first side distal to the first side of the mask area and a second side proximal to the first side of the mask area; and
a pitch in the plurality of pitches between the first side of the mask area and the first side of the adjacent mask segment is greater than the mask line pitch and less than twice the mask line pitch.

15. The method of claim 11, wherein transition structures in the plurality of transition structures have a transition structure pitch in the first direction relative to adjacent transition structures in the plurality of transition structures, and the mask segments in the plurality of mask segments have lengths extending a majority of the transition structure pitch.

16. The method of claim 11,
adjacent transition structures in the plurality of transition structures being offset by the mask line pitch in the second direction; and
adjacent first mask lines in the plurality of first mask lines terminating at respective adjacent transition structures in the plurality of transition structures.

17. The method of claim 11, wherein
mask segments in the plurality of mask segments each have a first end and a second end opposite the first end in the first direction; and
the plurality of mask segments disposed between a pair of mask linking lines includes a first set of mask segments connected at the first end to a first mask line in the pair and separated at the second end from a mask linking line in the pair, and a second set of mask segments connected at the second end to the mask linking line in the pair and separated at the first end from the first mask line in the pair,
mask segments in the first set being interdigitated with mask segments in the second set in the second direction.

18. The method of claim 11, wherein
mask segments in the plurality of mask segments each have a first end and a second end opposite the first end in the first direction; and
the plurality of mask segments disposed between a pair of mask linking lines includes at least a mask segment separated at the first end from a first mask line in the pair and separated at the second end from a mask linking line in the pair.

19. The method of claim 11, wherein
mask segments in the plurality of mask segments each have a first end and a second end opposite the first end in the first direction; and
the plurality of mask segments disposed between a pair of mask linking lines includes a first set of mask segments connected at the first end to a first mask line in the pair and not aligned at the second end, and a second set of mask segments connected at the second end to the mask linking line in the pair and not aligned at the first end,
mask segments in the first set of mask segments being aligned with respective mask segments in the second set of mask segments in the second direction.

20. The method of claim 19, wherein transition structures in the plurality of transition structures have a transition structure pitch in the first direction relative to adjacent transition structures in the plurality of transition structures, a sum of a first length of a first mask segment in the first set of mask segments and a second length of a second mask segment in the second set of mask segment aligned with the first mask segment in the second direction extending a majority of the transition structure pitch.

21. The method of claim 11, wherein the substrate includes a layer of sacrificial material over a layer of hard mask material over a layer of conductive material, said executing a self-aligned double patterning process comprising:
etching the layer of sacrificial material to form a sacrificial pattern using the mask;
forming sidewall spacers on the sacrificial pattern on the layer of hard mask material;
removing the sacrificial pattern while the sidewall spacers remain;
etching the layer of hard mask material using the sidewall spacers as an etch mask to form a hard mask; and
etching the layer of conductive material using the hard mask to form conducting lines.

* * * * *